US006532574B1

(12) United States Patent
Durham et al.

(10) Patent No.: US 6,532,574 B1
(45) Date of Patent: Mar. 11, 2003

(54) POST-MANUFACTURE SIGNAL DELAY ADJUSTMENT TO SOLVE NOISE-INDUCED DELAY VARIATIONS

(75) Inventors: Christopher McCall Durham, Round Rock, TX (US); Sharad Mehrotra, Austin, TX (US); Alexander Koos Spencer, Austin, TX (US); Barry Duane Williamson, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 09/640,537

(22) Filed: Aug. 17, 2000

(51) Int. Cl.7 .............................................. G06F 17/50
(52) U.S. Cl. .................... 716/6; 716/6; 716/5
(58) Field of Search .................. 716/6, 5, 4; 702/64; 327/292; 326/44

(56) References Cited

U.S. PATENT DOCUMENTS

| | | | | |
|---|---|---|---|---|
| 4,803,709 A | * | 2/1989 | Kimata | 257/239 |
| 5,101,122 A | * | 3/1992 | Shinonara | 326/44 |
| 5,568,395 A | * | 10/1996 | Huang | 703/13 |
| 6,288,589 B1 | * | 9/2001 | Potter et al. | 327/292 |
| 6,314,546 B1 | * | 11/2001 | Muddu | 716/5 |
| 6,353,917 B1 | * | 3/2002 | Muddu et al. | 702/64 |

OTHER PUBLICATIONS

Sicard et al, "Analysis of Crosstalk Interference in CMOS Integrated Circuits" IEEE, May 1992, pp. 124–129.*
Lee et al, "Test Generation For Crosstalk Effects in VLSI Circuits" IEEE, Sep. 1996, pp. 628–631.*

* cited by examiner

Primary Examiner—Vuthe Siek
Assistant Examiner—Binh Tat
(74) Attorney, Agent, or Firm—Casimer K. Salys; Bracewell & Patterson, L.L.P.

(57) ABSTRACT

Adjacent signal lines within the critical path of logic within an integrated circuit are checked for capacitive coupling induced signal delay variations resulting from concurrent signal transitions. When found, signal transition overlap is eliminated by delaying the clock edge (rising or falling) triggering the signal driving logic, without necessarily delaying the other clock edge. A delay circuit is incorporated into clock stages for the signal driving logic, and may be selectively actuated to delay the clock edge to particular signal driving logic circuits. Selection of signal lines in which signal transitions are to be delayed may be performed after manufacture of the integrated circuit, and iterative determinations may be required since signal adjustment may create new critical paths within the integrated circuit logic. Once the final signal adjustment configuration is determined, that configuration may be stored as a vector within a memory in the integrated circuit and read during power-up into a scan chain controlling the individual delay circuits.

20 Claims, 7 Drawing Sheets

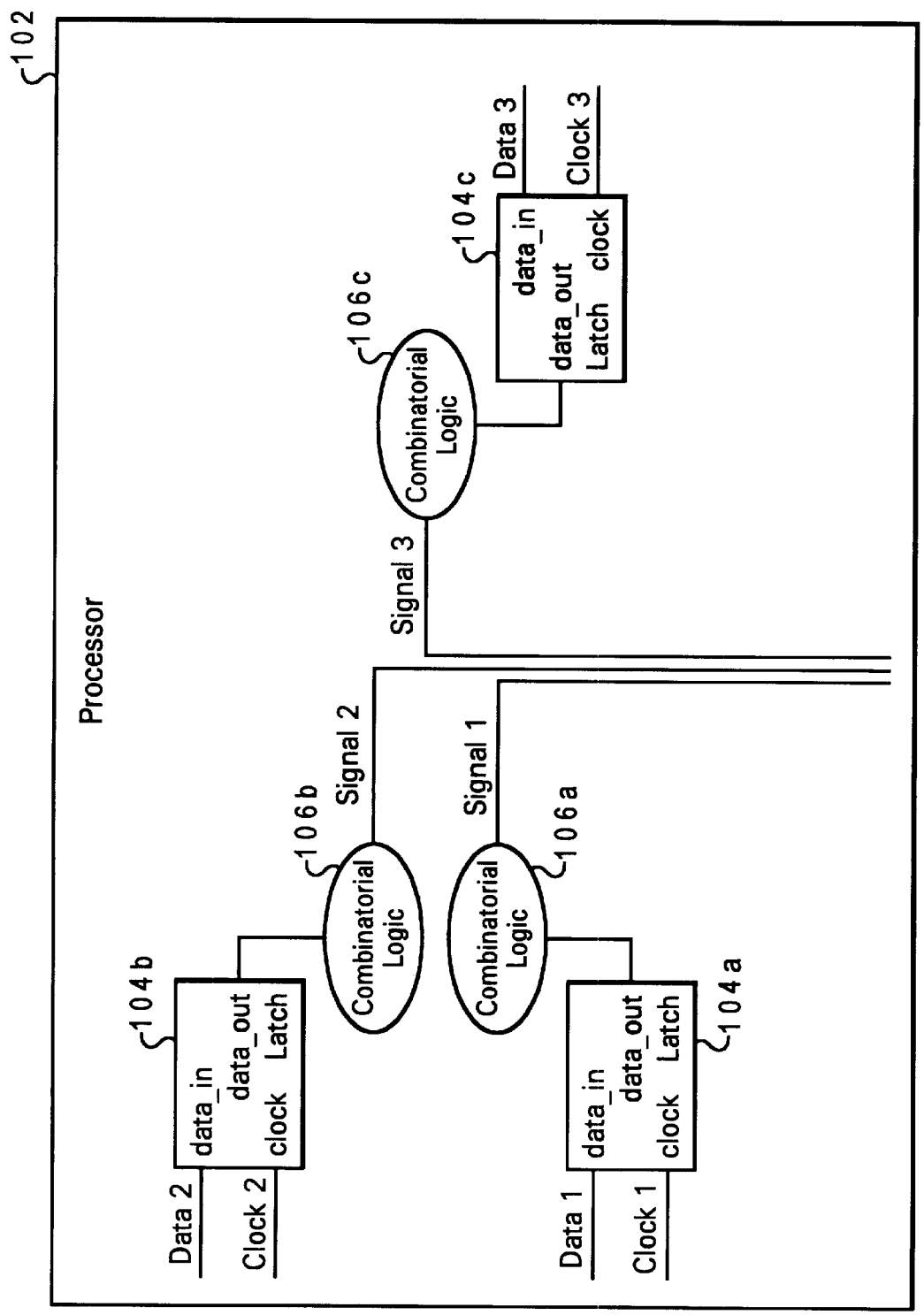

POST-MANUFACTURE SIGNAL DELAY ADJUSTMENT TO SOLVE NOISE-INDUCED DELAY VARIATIONS

BACKGROUND OF THE INVENTION

1. Technical Field

The present invention relates generally to integrated circuit design and in particular to minimizing capacitive coupling signal delays in integrated circuit designs. Still more particularly, the present invention relates to post-manufacture adjustment of signal arrival times to reduce capacitive coupling signal delays.

2. Description of the Related Art

As feature sizes within integrated circuits shrink, architectures grow more complex, and higher operating speeds are sought, integrated circuit designers face increasing issues in meeting performance objectives. Many problems once thought minor in importance or rare in occurrence are becoming more significant and/or pronounced.

One such problem is on-chip noise. Noise may take various forms and cause varying effects. Some common forms of noise are power supply droop and localized power variations, signal line coupling, and Miller effect capacitances across circuit inputs/outputs. Some common effects of such noise are reduced or varying design performance, latch (memory) state loss, and signal propagation variation. A more subtle effect of noise, however, is change in signal delay due to capacitive coupling. That is, a given signal line routed adjacent to other signal lines creates, as a result of the metallurgical manufacturing process, a capacitor between those signal lines.

FIG. 8 illustrates the capacitance formed between adjacent signal lines. In the example shown, Signal 2 has two adjacently routed signal lines or interconnects, Signal 1 and Signal 3, which add to the net capacitance of the conductor. This capacitance due to adjacent signal lines, denoted $C_{adj}$, is in addition to the vertical capacitive components and any sink (gate) capacitance, which is collectively denoted $C_{base}$ in FIG. 8. The capacitance of the signal line Signal 2 due to the additional capacitance $C_{adj}$ from adjacent signal lines may be significantly greater than would be seen for the interconnect Signal 2 without adjacent signal lines Signal 1 and Signal 3.

The capacitance of signal line Signal 2 (denoted $C_{signal2}$) varies under different switching conditions. The amount of capacitance contributed to the total capacitance $C_{signal2}$ seen by signal line Signal 2 by an adjoining signal lines depends on whether the adjoining signal lines switch state, and in which direction (i.e., rising or falling) relative to switching within signal line Signal 2. Assuming that the adjacent signal lines Signal 1 and Signal 3 arrive (are driven) at the same time and rise/fall at the same slew rate, there are three different possible capacitances for each adjacent signal line which may be contributed to the total capacitance $C_{signal2}$. If the adjacent signal line does not switch state (i.e., is "quiet"), then the capacitive contribution of the adjacent signal line is $C_{adj}$. A first order approximation of the total capacitance $C_{signal2}$ seen by signal line Signal 2 under different possible switching conditions is set forth in Table I.

TABLE I

| Signal 1 | Signal 2 | Signal 3 | $C_{signal2}$ |
| --- | --- | --- | --- |
| Quiet | Rising | Quiet | $C_{base} + 2{*}C_{adj}$ |
| Quiet | Falling | Quiet | $C_{base} + 2{*}C_{adj}$ |
| Quiet | Rising | Rising | $C_{base} + {*}C_{adj}$ |
| Quiet | Falling | Falling | $C_{base} + C_{adj}$ |
| Quiet | Rising | Falling | $C_{base} + 3{*}C_{adj}$ |
| Quiet | Falling | Rising | $C_{base} + 3{*}C_{adj}$ |
| Rising | Rising | Quiet | $C_{base} + C_{adj}$ |
| Falling | Falling | Quiet | $C_{base} + C_{adj}$ |
| Falling | Rising | Quiet | $C_{base} + 3{*}C_{adj}$ |
| Rising | Falling | Quiet | $C_{base} + 3{*}C_{adj}$ |
| Rising | Rising | Falling | $C_{base} + 2{*}C_{adj}$ |
| Rising | Falling | Falling | $C_{base} + 2{*}C_{adj}$ |
| Falling | Rising | Rising | $C_{base} + 2{*}C_{adj}$ |
| Falling | Falling | Rising | $C_{base} + 2{*}C_{adj}$ |
| Rising | Rising | Rising | $C_{base}$ |
| Falling | Falling | Falling | $C_{base}$ |
| Rising | Falling | Rising | $C_{base} + 4{*}C_{adj}$ |
| Falling | Rising | Falling | $C_{base} + 4{*}C_{adj}$ |

If the adjacent signal line switches state in the same direction as signal line Signal 2 (i.e., both rising or both falling), then no charge is required to counteract the adjacent capacitance and the capacitive contribution of the adjacent signal line is essentially zero. If the adjacent signal line switches state in the opposite direction as signal line Signal 2 (i.e., rising rather than falling or falling rather than rising), then twice as much charge is required to counteract the adjacent capacitance and the capacitive contribution of the adjacent signal line is $2{*}C_{adj}$.

During timing analysis, capacitive effects of neighboring conductors are relatively simple to offset by increasing or decreasing the net capacitance due to adjacency in order to account for latest/earliest possible effects. For example, increasing the total capacitance due to worst-case adjacent signal line switching may be performed after the capacitance calculation, then utilized in the timing run. However, this depends heavily on reliably predicting the arrival times and slew rates for signals on all neighboring signal lines. Since changing the total capacitance due to such switching characteristics depends on the total capacitance, the process is iterative in nature. That is, timing calculations prior to increasing the capacitance are not longer accurate in terms of arrival times and slew rates after the increase because of loading changes associated with the increase.

Although calculating switching capacitance effects appears simple for a case such as that shown in FIG. 8, in complex designs such as superscalar processors a signal line may have any number of adjacent signal lines (well beyond the two shown in FIG. 8) with a sufficiently significant capacitive coupling value to induce delay variations. When also accounting for all possible signal arrival and slew miscalculations (due to static timing analysis assumptions, inaccurate circuit timing models, interconnect modeling approximations, parasitic extraction inaccuracy, etc.) and all process variations (e.g., interconnect width/spacing variation leading to significant variation in coupling capacitance values), iteratively processing the results through multiple timing runs is essentially impossible.

These problems have resulted in two design approaches. The first approach simply doubles all coupling capacitances above a set tolerance for all signal lines in a design. This approach is overly pessimistic and leads to overdesign of the circuitry, and also tends to create a slower than optimal design because many circuits are redesigned to provide increased drive strength to counteract the expected additional loading. A larger driver creates a larger gate capacitance on the source, which necessitates a larger circuit and/or slower perormance. This, in turn, can lead to slower than expected results on the actual manufactured design, resulting in decreased design performance as well as increased design time.

The second approach ignores the effects altogether, which leads to slower than expected results on the actual manufactured design and decreased design performance, but reduces design time. Fixing any noise induced delay problems requires new mask designs and new chips, although more often than the alternate approach.

It would be desirable, therefore, to eliminate the coupling induced delay variation on the design post-manufacture, following the second approach and using existing manufactured chips at the highest possible frequency. In addition, any problems not properly accounted for in the first approach could also be solved, again providing use of existing chips at a higher performance.

SUMMARY OF THE INVENTION

It is therefore one object of the present invention to provide improved integrated circuit designs.

It is another object of the present invention to minimize capacitive coupling signal delays in integrated circuit designs.

It is yet another object of the present invention to provide post-manufacture adjustment of signal arrival times to reduce capacitive coupling signal delays.

The foregoing objects are achieved as is now described. Adjacent signal lines within the critical path of logic within an integrated circuit are checked for capacitive coupling induced signal delay variations resulting from concurrent signal transitions. When found, signal transition overlap is eliminated by delaying the clock edge (rising or falling) triggering the signal driving logic, without necessarily delaying the other clock edge. A delay circuit is incorporated into clock stages for the signal driving logic, and may be selectively actuated to delay the clock edge to particular signal driving logic circuits. Selection of signal lines in which signal transitions are to be delayed may be performed after manufacture of the integrated circuit, and iterative determinations may be required since signal adjustment may create new critical paths within the integrated circuit logic. Once the final signal adjustment configuration is determined, that configuration may be stored as a vector within a memory in the integrated circuit and read during power-up into a scan chain controlling the individual delay circuits.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 depicts a block diagram of an integrated circuit in which post-manufacture signal delay adjustment is performed in accordance with a preferred embodiment of the present invention;

DETAILED DESCRIPTION OF THE PREFERRED EMBODIMENT

With reference now to the figures, and in particular with reference to FIG. 1, a block diagram of an integrated circuit in which post-manufacture signal delay adjustment is performed in accordance with a preferred embodiment of the present invention is depicted. In the example shown, the integrated circuit 102 is a processor, although the present invention may be employed with any integrated circuit in which signal lines are routed adjacent to each other. The exemplary embodiment of FIG. 1 depicts latches 104a–104c controlled by clock signals Clock 1, Clock 2 and Clock 3, respectively. Latches 104a–104c receive data signals and output such data signals on the next rise of clock signals Clock 1, Clock 2 and Clock 3—that is, latches 104a–104c are edge-triggered latches operating on the rising edge of the clock signal.

Figure 8:
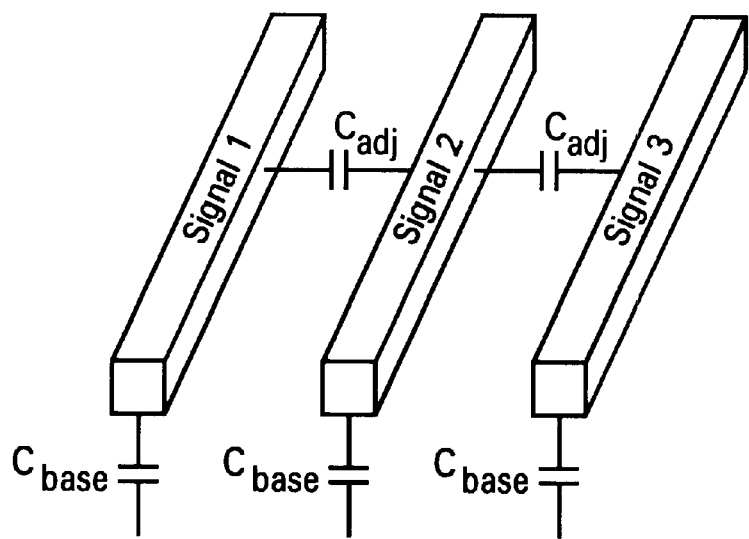
FIG. 8 is a pictorial representation of adjacent signal lines and related capacitive effects within an integrated circuit.

The outputs of latches 104a, 104b and 104c pass through combinatorial logic 106a, 106b and 106c, respectively, before being transmitted on signal lines Signal 1, Signal 2, and Signal 3 across integrated circuit 102 to other logic (not shown). As depicted in FIG. 1, signal lines Signal 1, Signal 2, and Signal 3 are routed adjacent to each other by necessity (e.g., space limitations for the metallization layer in which signal lines Signal 1, Signal 2, and Signal 3 is formed). As described above in connection with FIG. 8 and Table I, if the signals on signal lines Signal 1 and Signal 3 arrive at approximately the same time as the signal on signal line Signal 2, then the switching capacitance seen on signal line Signal 2 will be increased in accordance with Table I.

Figure 2A:
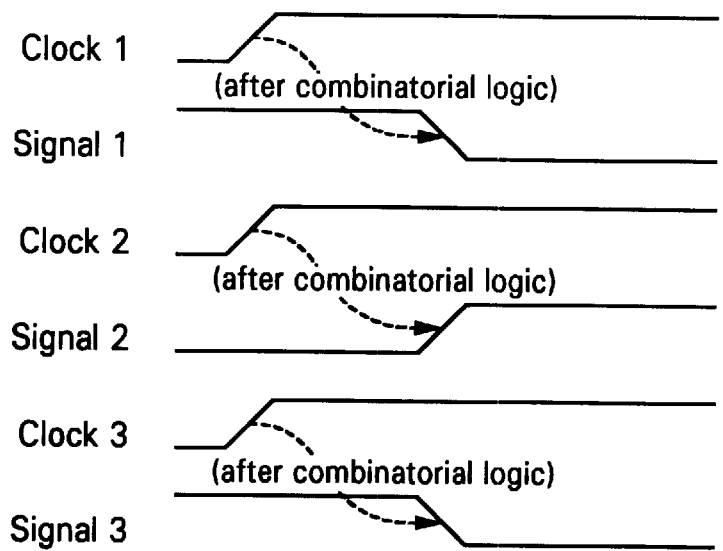
FIGS. 2A–2B are comparative timing diagrams before and after post-manufacture signal delay adjustment in accordance with a preferred embodiment of the present invention.
Figure 2B:
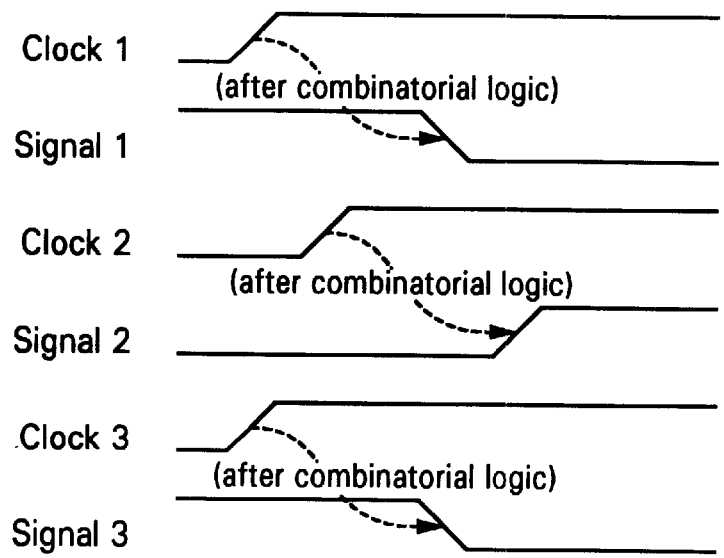

Referring to FIGS. 2A and 2B, which are intended to be read in conjunction with FIG. 1, comparative timing diagrams before and after post-manufacture signal delay adjustment in accordance with a preferred embodiment of the present invention are illustrated. FIG. 2A illustrates a timing diagram for operation of the circuit depicted in FIG. 1 prior to post-manufacture signal delay adjustment. It should be noted that the nature of integrated circuit design insures that each of the three signals on signal lines Signal 1, Signal 2, and Signal 3 are sources from latches 104a–104c somewhere in their upstream paths. Moreover, integrated circuit designs typically employ a centralized clocking system. That is, each latch clock signal Clock 1, Clock 2 and Clock 3 is designed to be nearly identical in arrival time and slew rate at each latch 104a–104c. This similitude is typically achieved by distributing a single main clock signal through a system of buffering across the entire design, ultimately ending up at the latch circuits 104a–104c.

Figure 3:
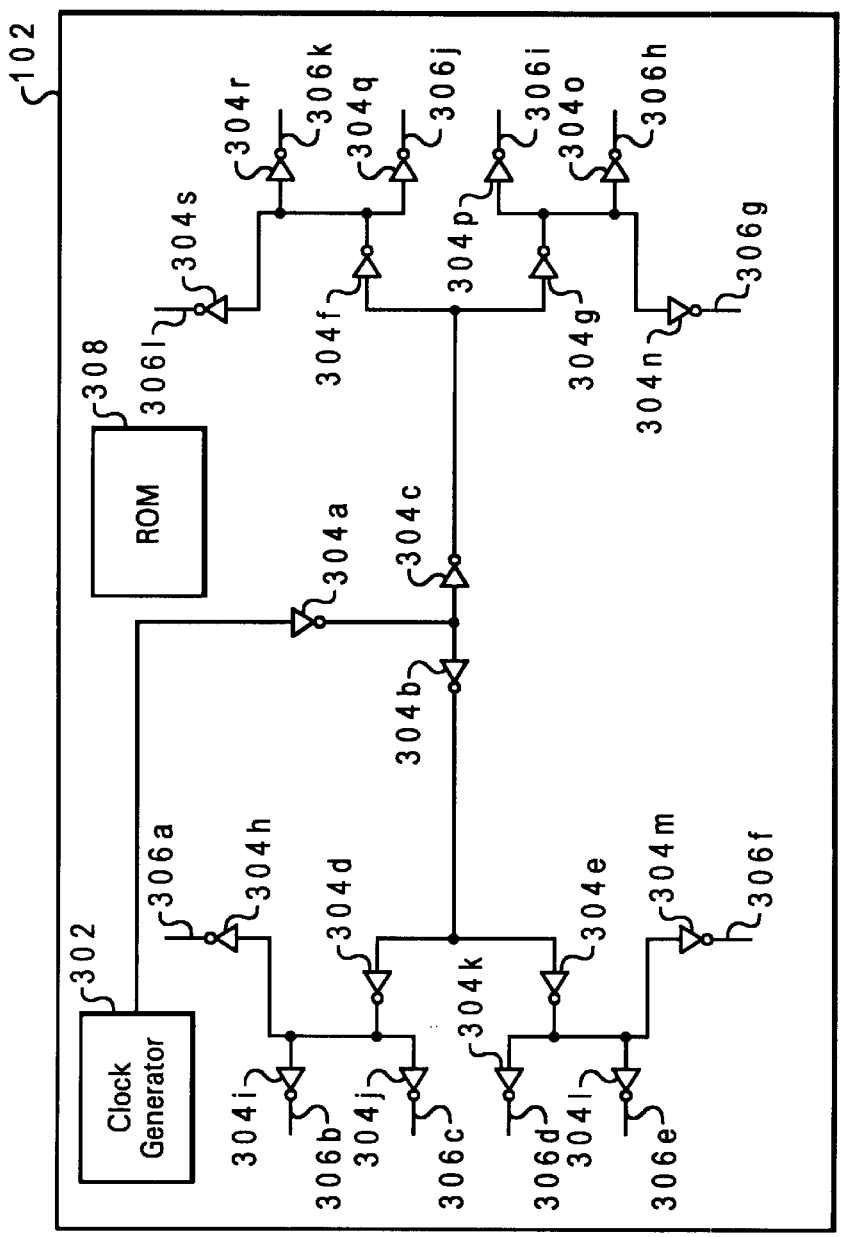
FIG. 3 depicts a clocking system employed in post-manufacture signal delay adjustment in accordance with a preferred embodiment of the present invention.

With reference to FIG. 3, which is intended to be read in conjunction with FIGS. 1 and 2A–2B, a clocking system employed in post-manufacture signal delay adjustment in accordance with a preferred embodiment of the present invention is depicted. As previously described, integrated circuit 102 includes a clock generator 302 which generates a single main clock signal for integrated circuit 102. This single main clock signal is distributed to different regions of integrated circuit 102 by a network of inverting buffers 304a–304s. Although each stage depicted in FIG. 3 is a simple inverting buffer of the main clock signal, in reality each stage will generally be a combination of buffering stages which may or may not invert the main clock signal. An example circuit for each buffer stage is described in further detail below.

The outputs 306a–306l of output buffers 304h–304s provide the clock signals Clock 1, Clock 2 and Clock 3 for latches 104a–104c. The clock signals Clock 1, Clock 2 and Clock 3 to the latches 104a–104c are adjustable in time through a post-manufacture mechanism. The arrival times for clock signals Clock 1, Clock 2 and Clock 3 at latches 104a–104c may be varied by controlling buffers 304h–304s to solve any timing problems associated with noise-induced delay variations. The timing diagram of FIG. 2B illustrates the result of moving the rising edge of clock signal Clock 2 later in time by a small amount relative to the rising edges of clock signals Clock 1 and Clock 2. By movement relative to the adjacent switching signals on signal lines Signal 1 and Signal 2, the capacitive effect on signal line Signal 2 is reduced from $C_{base}+4*C_{adj}$ for the timing sequence illustrated in FIG. 2A to $C_{base}+2*C_{adj}$ for the timing sequence illustrated in FIG. 2B. This reduction in capacitance may be achieved by changing the last stage of buffering, buffers 304h–304s, in the clock buffering system of FIG. 3 to provide an override control to delay the rising clock edge for clock signal Clock 2 as described.

Figure 4:
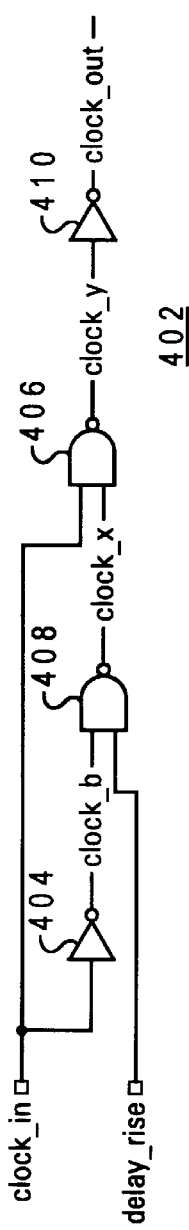
FIG. 4 is a circuit diagram for an override delay control circuit providing post-manufacture signal delay adjustment in accordance with a preferred embodiment of the present invention.

Referring to FIG. 4, a circuit diagram for an override delay control providing post-manufacture signal delay adjustment in accordance with a preferred embodiment of the present invention is illustrated. Delay override control circuit 402 is preferably implemented in each of buffers 304h–304s depicted in FIG. 3. The delay override control circuit 402 depicted is non-inverting, and may form only part of the buffering circuits within buffers 304h–304s—that is, buffers 304h–304s may include additional inverters not shown in FIG. 4.

The clock signal clock_in received by delay override control circuit 402 within one of buffers 304h–304 s is routed to inverter 404 and to one input of NAND gate 406. The output of inverter 404 (signal clock_b) is routed to one input of NAND gate 408, while signal line delay_rise is routed to the other input of NAND gate 408. The output of NAND gate 408 (signal clock_x) is routed to the remaining input of NAND gate 406, while the output of NAND gate 406 (signal clock_y) is routed through inverter 410 and output as signal clock_out.

The operation of delay override control circuit 402 is controlled by the state of signal line delay_rise. If signal line delay_rise is a logical 0 (low) then signal clock_x at the output of NAND gate 408 will always be high. Because signal clock_x is high, NAND gate 406 passes signal clock_in to signal clock_y (inverted), causing NAND gate 406 to logically act as an inverter. Inverter 410 then inverts signal clock_y to produce output signal clock_out. If signal delay_rise is high, then NAND gate 408 passes signal clock_b to signal clock_x (inverted). When signal clock_in rises, NAND gate 406 will not immediately allow signal clock_y to fall. Instead, NAND gate 406 must wait until signal clock_x also rises through inverter 404 and NAND gate 408, introducing a delayed rising edge at signal clock_out via inverter 410. When signal clock_x falls, however, NAND gate 406 will immediately allow a rising edge on signal clock_y, forcing inverter 410 to immediately drive signal clock out to fall.

Figure 5A:
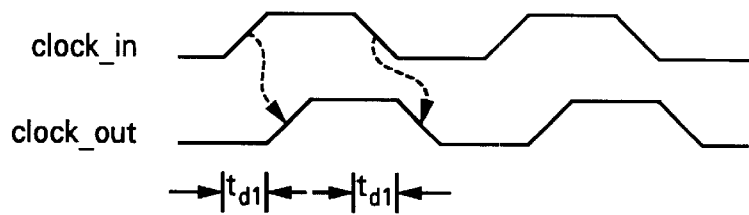
FIGS. 5A–5C depict comparative timing diagrams for a standard two-inverter buffer and an override delay control circuit in accordance with a preferred embodiment of the present invention.
Figure 5B:
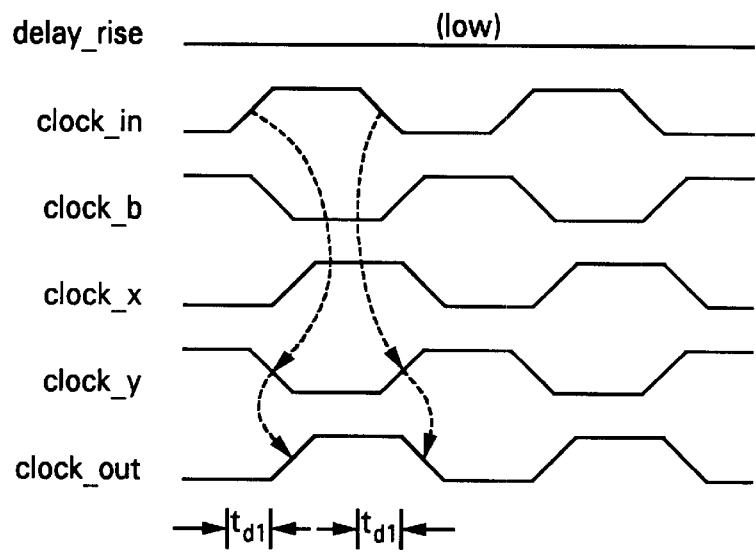

With reference now to FIGS. 5A through 5B, comparative timing diagrams for a standard two-inverter buffer and an override delay control circuit in accordance with a preferred embodiment of the present invention are depicted. FIG. 5A depicts a timing diagram for a standard two-inverter buffer. Propagation delays cause a timing delay $t_{d1}$ between both the leading (rising) edges and the trailing (falling) edges of signals clock_in and clock_out.

FIG. 5B depicts a timing diagram for the override delay control circuit depicted in FIG. 4 when signal delay_rise is low. When signal delay_rise is low, the fall of signal clock_y is driven by a rise in signal clock_in, and drives, in turn, a rise in signal clock_out. Similarly, a fall of signal clock_out is driven, through signal clock_y, by a fall in signal clock_in. The leading edge of signal clock_y is delayed with respect to the leading edge of signal clock_in, and the leading edge of signal clock_out is delayed with respect the leading edge of signal clock_y, resulting in a total timing delay $t_{d1}$ between the leading d edges of signals clock_in and clock_out equal to the same delay seen in a standard two-inverter buffer, as depicted in FIG. 5A. Likewise, propagation delays between signals clock_in and clock_y and between signals clock_y and clock_out result in a total timing delay $t_{d1}$ between the trailing edges of signals clock_in and clock_out equal to the same delay $t_{d1}$ seen in a standard two-inverter buffer.

Figure 5C:
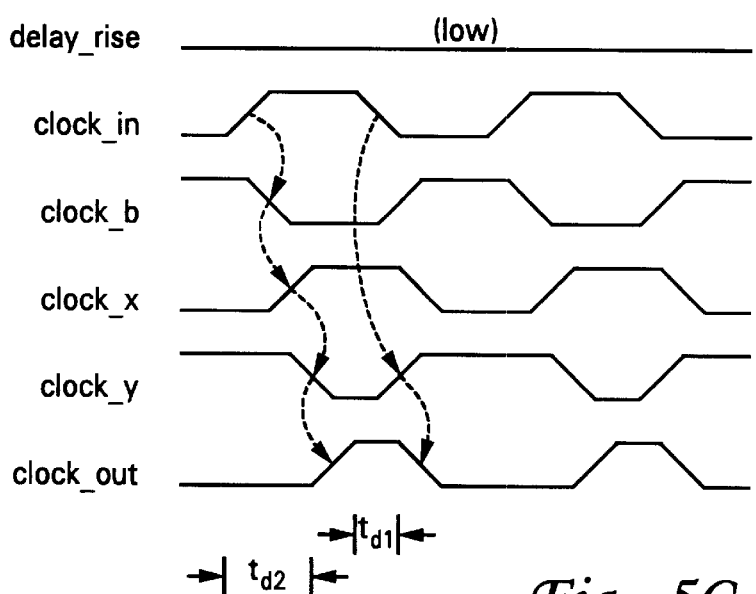

FIG. 5C depicts a timing diagram for the override delay control circuit depicted in FIG. 4 when signal delay_rise is high. When signal delay_rise is high, the rise of signal clock_in drive a fall in signal clock_b, which in turn drive a rise in signal clock_x, which in turn drives a fall in signal clock_y, which then drives a rise in signal clock_out. However, a fall of signal clock_out is driven dirctly through signal clock_y by a fall in signal clock_in, without being affected by signals clock_b and clock_x. The leading edge of signal clock_out is therefore delayed with respect to the leading edge of signal clock_in by a total timing delay $t_{d2}$ greater than the corresponding delay in a standard two-inverter buffer (with timing delay $t_{d2}$ being twice as long as timing delay $t_{d1}$ in the example shown). Propagation delays between the trailing edges of signals clock_in and clock_out, however, equals the same delay $t_{d1}$ seen in a standard two-inverter buffer.

For the override delay control circuit depicted in FIG. 4 when signal delay_rise is high, the rising edge of the clock signal—which may drive a logic change at the output when received by the respective latch—is therefore delayed in the manner shown in FIG. 2B to reduce capacitive effects in the corresponding signal line. The is trailing edge of the clock signal, which does not drive any output changes for the latch receiving that clock signal, need not be delayed. By selectively delaying the rising edge of clock signals to certain latches within the last buffering stage (buffers 304h–304s) in the clock buffering system of FIG. 3, capacitive effects between adjacent signal lines within the integrated circuit 102 may be reduced, resulting in a corresponding reduction in timing delays.

It should be noted that the amount of edge movement of the rising edges of the clock signals received at various latches (e.g., clock signals Clock 1, Clock 2 or Clock 3) need not be restricted to a single value. Rather, many circuits may be similarly designed to provide a notched amount of clock movement.

In the present invention, override delay control circuit 402 (FIG. 4) is employed to control the clock signals of the latches 304h–304s (FIG. 3). To accommodate all possible combinations of delay adjustment, the control of the rising edge delay for each clock buffering latch 304h–304s is preferably controlled independently. That is, only one signal may be the coupling problem, or more than two signal lines may be involved, or the problem may be better solved by moving one or more "aggressor" neighbors (signal lines inducing the capacitive effects) rather than the "victim" signal line (the signal line which experiences the capacitive effects). Independent control over each clock buffering stage may be accomplished as described below.

Figure 6:
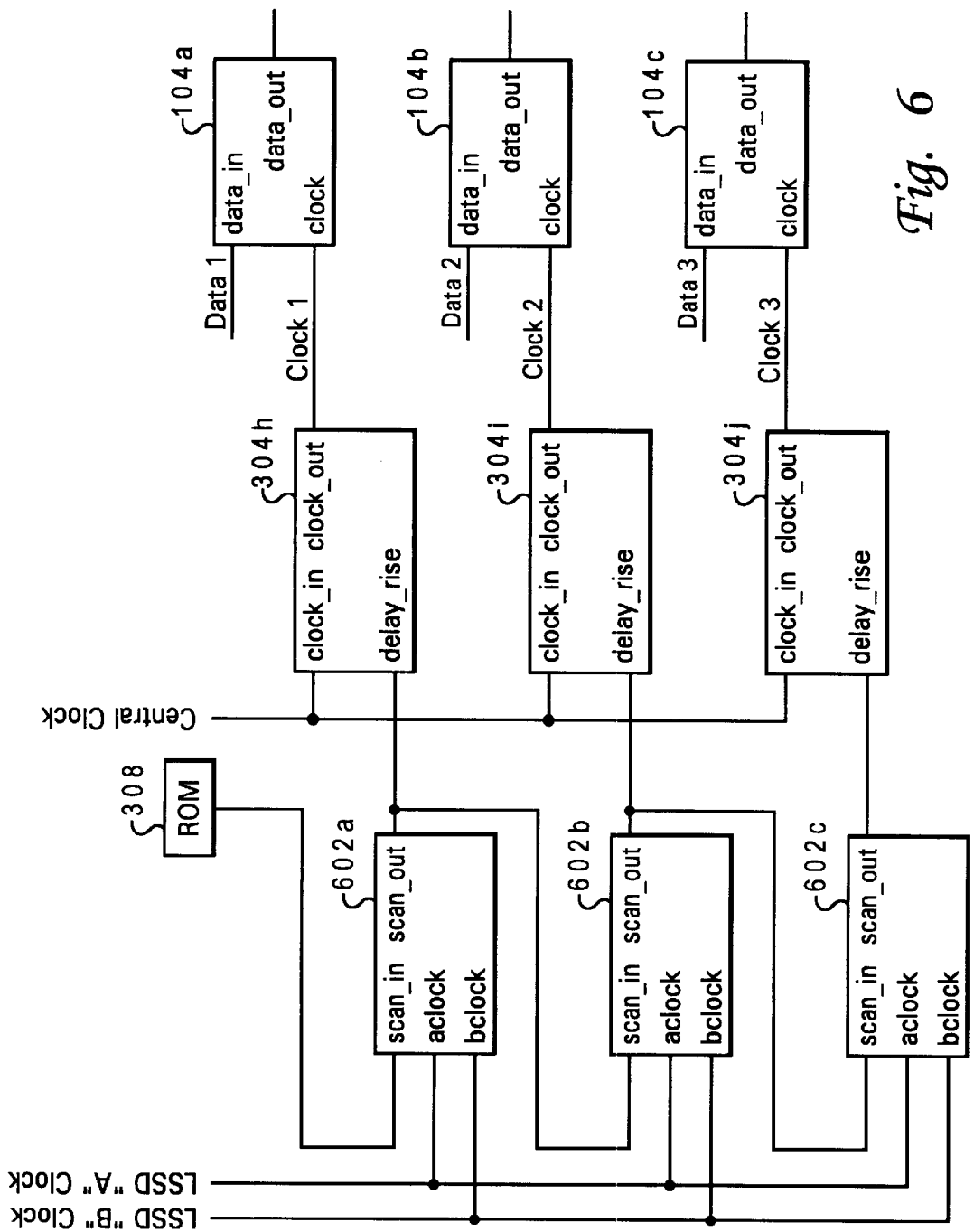
FIG. 6 is a circuit diagram for a system independently controlling delay control circuits within clock buffering stages to provide post-manufacture signal delay adjustment in accordance with a preferred embodiment of the present invention.

Referring to FIG. 6, a circuit diagram for a system independently controlling delay control circuits within clock buffering stages to provide post-manufacture signal delay adjustment in accordance with a preferred embodiment of the present invention is illustrated. The system depicted allows the movement of signal edges on adjacent signal lines through movement of corresponding clock edges as described above. During system debug of an integrated circuit design, a dedicated scan chain is loaded with a default value, then timing of the design is determined. The critical machine paths are then analyzed to determine if the timing is impacted by adjacent signal line capacitance variations. If such variations are found, the machine timing may be adjusted by individually altering the clock edges for the suspect signal lines (aggressors and/or victims) to improve timing. Due to launch time adjustment out of the latches, the decision on which signal lines to adjust may be iterative; moving data launch time will delay the evaluation of the logic, which may impact the timing adversely by virtue of introducing a new critical machine path unrelated to capacitive coupling.

Figure 7A:
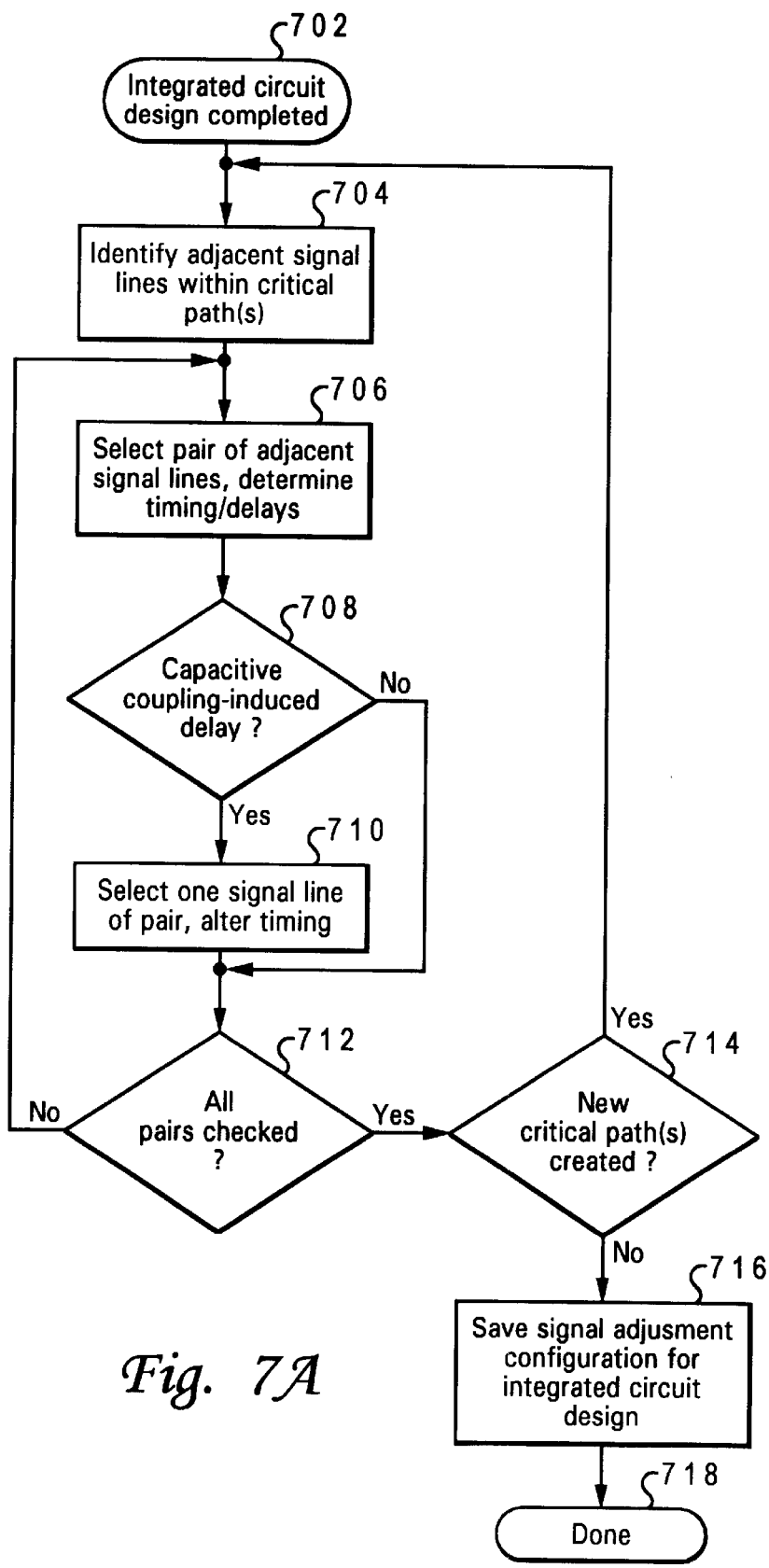
FIGS. 7A–7B depict high level flow charts for processes of determining and employing post-manufacture signal delay adjustments in accordance with a preferred embodiment of the present invention.

Integrated circuit 102 depicted in FIG. 1 includes dedicated scannable latches 602a through 602c as shown in FIG. 6. Scannable latches 602a through 602c are connected in a scan chain and have outputs connected to the delay_rise signal input for clock buffers 304h–304j. The delay_rise signals control the operation of clock buffers 304h–304j as described above in connection with FIGS. 5B and 5C. In particular, the delay_rise signals control whether the it triggering clock signals from clock buffers 304h–304j are delayed. After complete design characterization, the settings for dedicated scannable latches 602a–602c required to correct any capacitive coupling noise problems is determined for the entire design across the integrated circuit 102. These settings are then transferred as a vector to a start-up read-only memory (ROM) 308 within integrated circuit 102, which is read by the chain of scannable latches 602a–602c each time the integrated circuit 102 is powered on. Each delay_rise setting within the stored vector bets passed along the scan chain to the corresponding scannable latch 602a–602c, where the setting is employed to configure the clock buffer 304h–304j With reference now to FIGS. 7A and 7B, high level flow charts for processes of determining and employing post-manufacture signal delay adjustments in accordance with a preferred embodiment of the present invention are depicted. FIG. 7A depicts a process of determining post-manufacture signal delay adjustments. The process begins at step 702, which depicts an integrated circuit design being completed. Masks for fabricating the design and actual integrated circuits may optionally be manufactured.

The process first passes to step 704, which illustrates identifying pairs of adjacent signal lines within the critical path(s)—the circuit sequences constraining the timing and operational frequency—for the logic of the integrated circuit design. Although adjacent signal lines are most likely to exhibit capacitive coupling, other pairs likely to induce noise or timing delays due to capacitive coupling may also be identified and considered within this process. The process next passes to step 706, which depicts selecting a pair of the adjacent signal lines within a critical path for the integrated circuit design and determining whether any timing delays result from capacitive effects between the signal lines. This may be determined from simulations or from actual testing of integrated circuits (e.g., by comparing signal delays for rising/rising versus rising/falling signals within the adjacent signal lines).

The process then passes to step 708, which illustrates a determination of whether capacitive-coupling induced delay resulting from concurrent signal line state changes was detected in the selected signal line pair. If so, the process proceeds to step 710, which depicts selecting one signal line of the pair, and altering the timing of signals propagated on that signal line. The alteration is preferably delay of the selected signal by delaying the rising (or trailing) edge of the clock signal within the clock buffer stage for the logic driving the selected signal line, as described above. If no capacitive-coupling induced delay for the selected adjacent signal line pair is detected, however, the process proceeds instead directly to step 712, which illustrates a determination of whether all signal line pairs within the critical path(s) have been analyzed. If not, the process returns to step 706 for selection of another signal line pair and repeat of steps in 708 and 710 for that signal line pair.

Once all signal line pairs within the critical path(s) have been analyzed for capacitive-coupling induced signal propagation delays, the process proceeds from step 712 to step 714, which depicts a determination of whether new critical path(s) within the integrated circuit design were created by any signal adjustments which were performed. If so, the process returns to step 704 for a determination of signal line pairs within such critical paths. Otherwise, however, the process proceeds to step 716, which illustrates saving the signal adjustment configuration determined for the integrated circuit design. This configuration may be saved as a vector within a read-only memory as described above, or by programming delay circuits in appropriate clock buffer stages by blowing fuses. The process then passes to step 718, which illustrates the process becoming idle until another integrated circuit design is completed and requires signal adjustment.

Figure 7B:
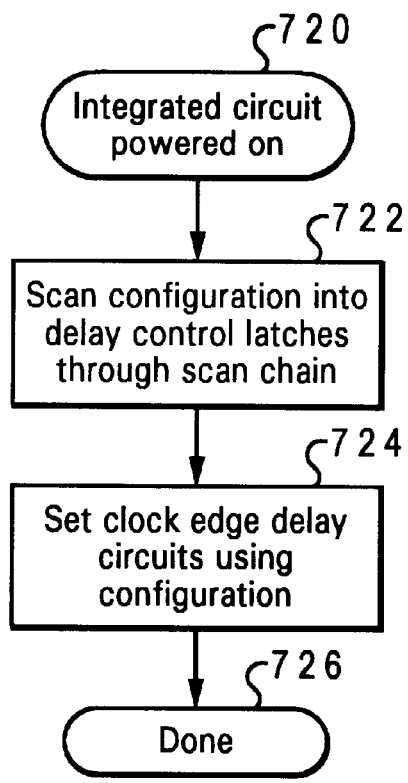

FIG. 7B depicts a process of utilizing post-manufacture signal adjustment within an integrated circuit design. The process depicted relates to designs of the type illustrated in FIG. 6, in which a scan chain or the like and a stored vector are employed to control signal adjustment. The process begins at step 720, which depicts an integrated circuit in which post-manufacture signal adjustment has been implemented being powered on. The process first passes to step 722, which illustrates scanning a signal adjustment vector from a memory within the integrated circuit into delay control latches at each clock buffer stage directly triggering signal generating logic through a scan chain.

The process next passes to step 724, which depicts setting triggering clock edge delay circuits according to the scanned configuration, eliminating overlap is signal transition periods for adjacent signal lines. The process then passes to step 726, which illustrates the process becoming idle until the integrated circuit is once again powered on.

The present invention reduces capacitive coupling induced signal delay variations without necessitating a new mask set, saving both design time and existing manufactured hardware. The post-manufacture signal adjustment for integrated circuit designs of the present invention may be employed to achieve a net performance improvement of up to 50 MHZ or more in operating frequency without new processing masks, saving substantial expense in design time and existing hardware while achieving better frequency targets. While prior art solutions to capacitive coupling induced delay variations typically involves redesign of the integrated circuit, necessitating new mask sets and abandonment of existing hardware, the present invention enables post-manufacture correction of capacitive coupling induced delay variations, saving existing hardware, design time and mask sets. As noted above, the present invention may also be implemented within integrated circuit design or simulation software to allow signal adjustment prior to manufacture.

It is important to note that while the present invention has been described in the context of fully functional hardware, those skilled in the art will appreciate that the mechanism of the present invention is capable of being distributed in the form of a computer usable medium of instructions in a variety of forms, and that the present invention applies equally regardless of the particular type of signal bearing medium used to actually carry out the distribution. Examples of computer usable mediums include: nonvolatile, hard-coded type mediums such as read only memories (ROMs) or erasable, electrically programmable read only memories (EEPROMs), recordable type mediums such as floppy disks, hard disk drives and CD-ROMs, and transmission type mediums such as digital and analog communication links.

While the invention has been particularly shown and described with reference to a preferred embodiment, it will be understood by those skilled in the art that various changes in form and detail may be made therein without departing from the spirit and scope of the invention.

What is claimed is:

1. A method of reducing capacitive coupling between two signal lines, said method comprising:
   identifying two signal lines for which overlap of signal transitions contributes to a capacitive coupling between the two signal lines;
   selecting one of the two signal lines; and
   shifting a signal transition on the selected signal line to minimize signal lines for overlap thereby reducing said capacitive coupling between the two signal lines.

2. The method of claim 1, wherein the step of identifying two signal lines for which overlap of signal transitions contributes to capacitive coupling between the two signal lines further comprises:
   identifying two adjacent signal lines within an integrated circuit.

3. The method of claim 1, wherein the step of identifying two signal lines for which overlap of signal transitions contributes to capacitive coupling between the two signal lines further comprises:
   identifying critical signal line pairs within an integrated circuit for which overlap of signal transitions contributes to capacitive coupling between the respective signal lines.

4. The method of claim 1, wherein the step of shifting a signal transition on the selected signal line further comprises:
   delaying a clock edge relative to a clock edge triggering logic driving signal transitions in signals on the another signal line to eliminate overlap of signal transitions between the two signal lines.

5. The method of claim 1, wherein the step of shifting a signal transition on the selected signal line further comprises:
   delaying a triggering clock edge that controls said signal transition without delaying a nontriggering clock edge that does not control said signal transition.

6. The method of claim 1, wherein the step of shifting a signal transition on the selected signal line further comprises:
   delaying a rising clock edge that controls said signal transition without delaying a falling clock edge that does not control said signal transition.

7. The method of claim 1, further comprising:
   for each signal line pair within an integrated circuit for which overlap of signal transitions contributes to capacitive coupling on the respective signal lines,
   selecting one of the respective signal lines within the signal line pair, and
   delaying a clock edge triggering logic driving signal transitions in signals on the selected signal line within the signal line pair relative to a clock edge triggering n logic driving signal transitions in signals on the other signal line within the signal line pair to eliminate overlap of signal transitions between the two signal lines.

8. An integrated circuit structure, comprising:
   two signal lines;
   first and second logic driving signal transitions on the two signal lines;
   first and second clock stages triggering and the first and second logic; and
   a delay circuit within one of the first and second clock stages delaying a triggering clock edge for that clock stage to eliminate overlap of signal transitions between the two signal lines, thereby reducing a capacitive coupling between said two signal lines caused by said overlap of said signal transitions.

9. The integrated circuit structure of claim 8, wherein the two signal lines further comprise:
   adjacent signal lines within the integrated circuit.

10. The integrated circuit structure of claim 8, wherein the delay circuit further comprises:
    a delay control enabling selective actuation of the delay circuit.

11. The integrated circuit structure of claim 8, wherein the delay circuit further comprises:
    a set of logic gates delaying the triggering clock edge without delaying the nontriggering clock edge.

12. The integrated circuit structure of claim 8, further comprising:
    a second delay circuit within the other of the first and second clock stages which does not delay a triggering clock edge for that clock stage.

13. The integrated circuit structure of claim 8, further comprising:

a processor including the signal lines, the first and second logic, the first and second clock stages, and the delay circuit.

14. The integrated circuit structure of claim 8, wherein the delay circuit further comprises:

a first NAND gate receiving a clock signal at a first input; and a second NAND gate receiving a delay control signal at a first input and a delayed, inverted clock signal at a second input, wherein an output of the second NAND gate is received at a second input of the first NAND gate.

15. The integrated circuit structure of claim 8, further comprising:

a plurality of clock stages each including a delay circuit delaying a clock signal to a corresponding signal driver, wherein each delay circuit which may be selectively actuated to delay signal transitions on a corresponding signal line to reduce capacitive coupling induced signal delay variations by preventing concurrent signal transitions on adjacent signal lines.

16. The integrated circuit structure of claim 15, further comprising:

a memory containing a sequence of control states corresponding to control signals for each delay circuit.

17. The integrated circuit structure of claim 16, further comprising:

a scan chain of latches each controlling a delay circuit, wherein the control states are scanned from the memory into the scan chain during power on of the integrated circuit structure.

18. A computer program product within a computer usable medium, comprising:

instructions for identifying each pair of Signal lines for which concurrent signal transitions contribute to capacitive coupling on the respective pair of signal lines;

instructions for selecting one of the respective pair of signal lines; and instructions for programing a delay circuit within a clock stage providing a clock signal to a driver for the selected signal line to delay a triggering clock edge received by the driver to reduce a capacitive coupling between said two signal lines caused by said concurrent signal transitions.

19. The computer program product of claim 18, further comprising:

instructions for repeating the selecting and programming instructions for each identified pair of signal lines within the integrated circuit simulation.

20. The computer program product of claim 19, further comprising:

instructions for saving a sequence of control states for programming delay circuits coupled to any signal line as a vector loading during power on of an integrated circuit fabricated utilizing the integrated circuit simulation.

* * * * *

UNITED STATES PATENT AND TRADEMARK OFFICE
CERTIFICATE OF CORRECTION

PATENT NO.     : 6,532,574 B1
DATED          : March 11, 2003
INVENTOR(S)    : Durham et al.

It is certified that error appears in the above-identified patent and that said Letters Patent is hereby corrected as shown below:

Column 9,
Lines 55-57, please replace with: -- shifting a signal transition on the selected signal line to minimize said signal transition overlap thereby reducing said capacitive coupling between the two signal lines. --

Column 10,
Lines 30-36, please replace with: -- delaying a clock edge triggering logic driving signal transitions in signals on the selected signal line within the signal line pair relative to a clock edge triggering logic driving signal transitions in signals on the other signal line within the signal line pair to eliminate overlap of signal transitions between the two signal lines. --

Column 12,
Lines 24-28, please replace with: -- instructions for saving a sequence of control states for programming delay circuits coupled to any signal line as a vector loaded during power on of an integrated circuit fabricated utilizing the integrated circuit simulation. --

Signed and Sealed this

Sixteenth Day of September, 2003

JAMES E. ROGAN
*Director of the United States Patent and Trademark Office*